United States Patent
Sasaki

(10) Patent No.: US 7,362,036 B2
(45) Date of Patent: Apr. 22, 2008

(54) ULTRASONIC OSCILLATOR

(75) Inventor: Yasuo Sasaki, Tokyo (JP)

(73) Assignee: Olympus Corporation, Tokyo (JP)

( * ) Notice: Subject to any disclaimer, the term of this patent is extended or adjusted under 35 U.S.C. 154(b) by 416 days.

(21) Appl. No.: 11/230,202

(22) Filed: Sep. 19, 2005

(65) Prior Publication Data

US 2006/0061241 A1    Mar. 23, 2006

(30) Foreign Application Priority Data

Sep. 22, 2004    (JP) .................. 2004-274708

(51) Int. Cl.
*H01I 41/083* (2006.01)
(52) U.S. Cl. ................................. 310/323.16
(58) Field of Classification Search ........... 310/323.16, 310/323.06, 366, 358, 349, 334
See application file for complete search history.

(56) References Cited

U.S. PATENT DOCUMENTS 4,564,980 A * 1/1986 Diepers .................. 29/25.35
4,646,870 A * 3/1987 Koch et al. .................. 180/336
5,644,440 A    7/1997 Akada

FOREIGN PATENT DOCUMENTS

| JP | 7-163162 | 6/1995 |
|----|----------|--------|
| JP | 8-179184 | 7/1996 |

* cited by examiner

*Primary Examiner*—Darren Schuberg
*Assistant Examiner*—Karen Addison
(74) *Attorney, Agent, or Firm*—Scully, Scott, Murphy & Presser, P.C.

(57) ABSTRACT

An ultrasonic oscillator, comprises a group of internal electrodes divided into four approximately equal parts along two directions, i.e., a second direction which is perpendicular to a direction of layers as first direction, and a third direction which is also perpendicular to the first direction; and comprises an electrode connection-use conductor film which is formed along a face perpendicular to the aforementioned direction of layers for electrically connecting a predetermined external electrode among the first group of external electrodes and a predetermined external electrode among the second group of external electrodes, respectively.

9 Claims, 12 Drawing Sheets

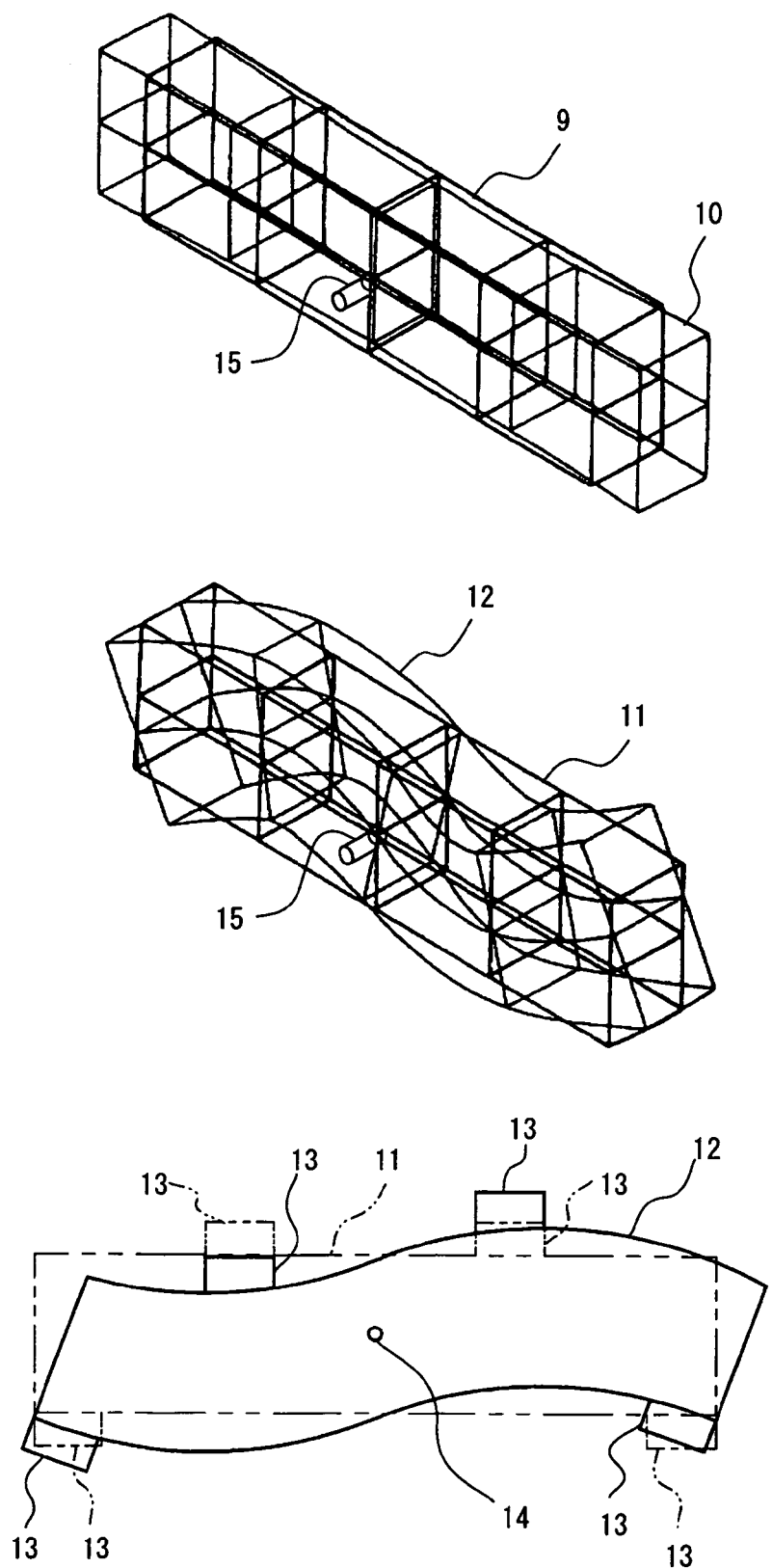
F I G. 2

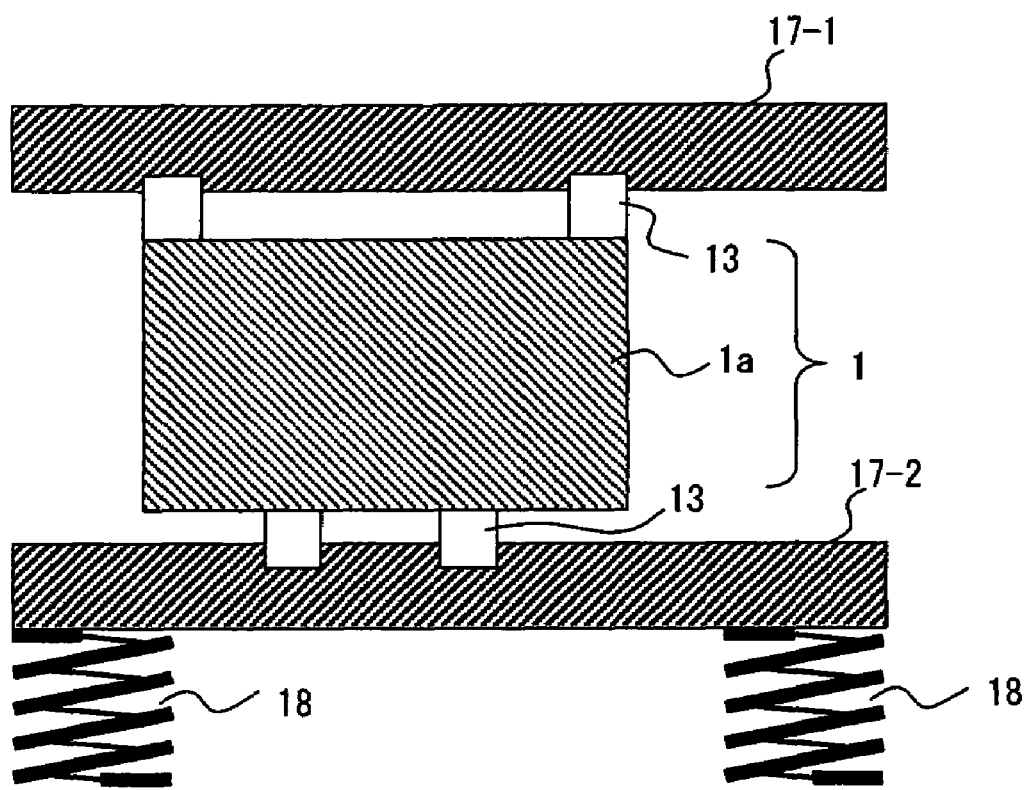
F I G. 4

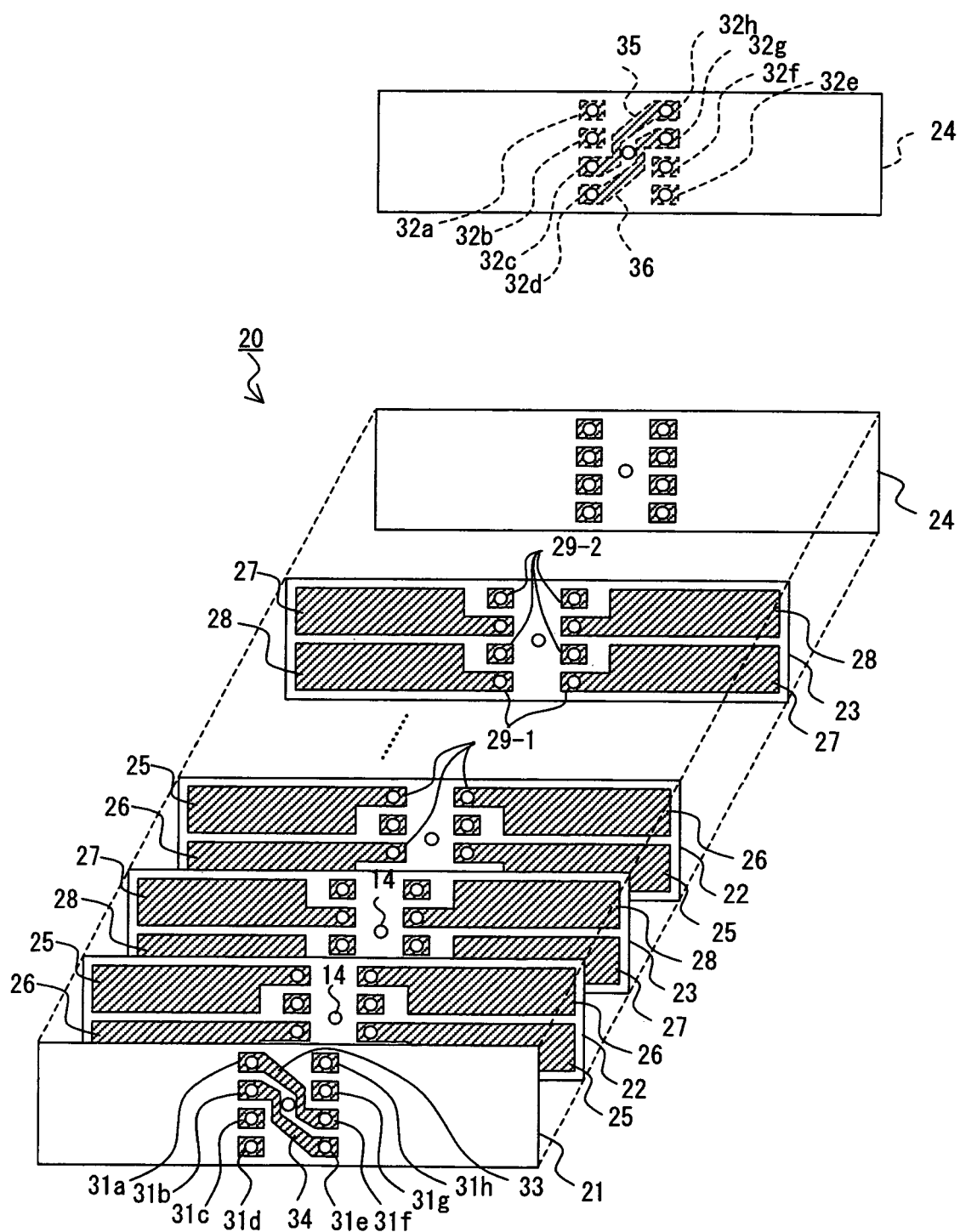
F I G. 5

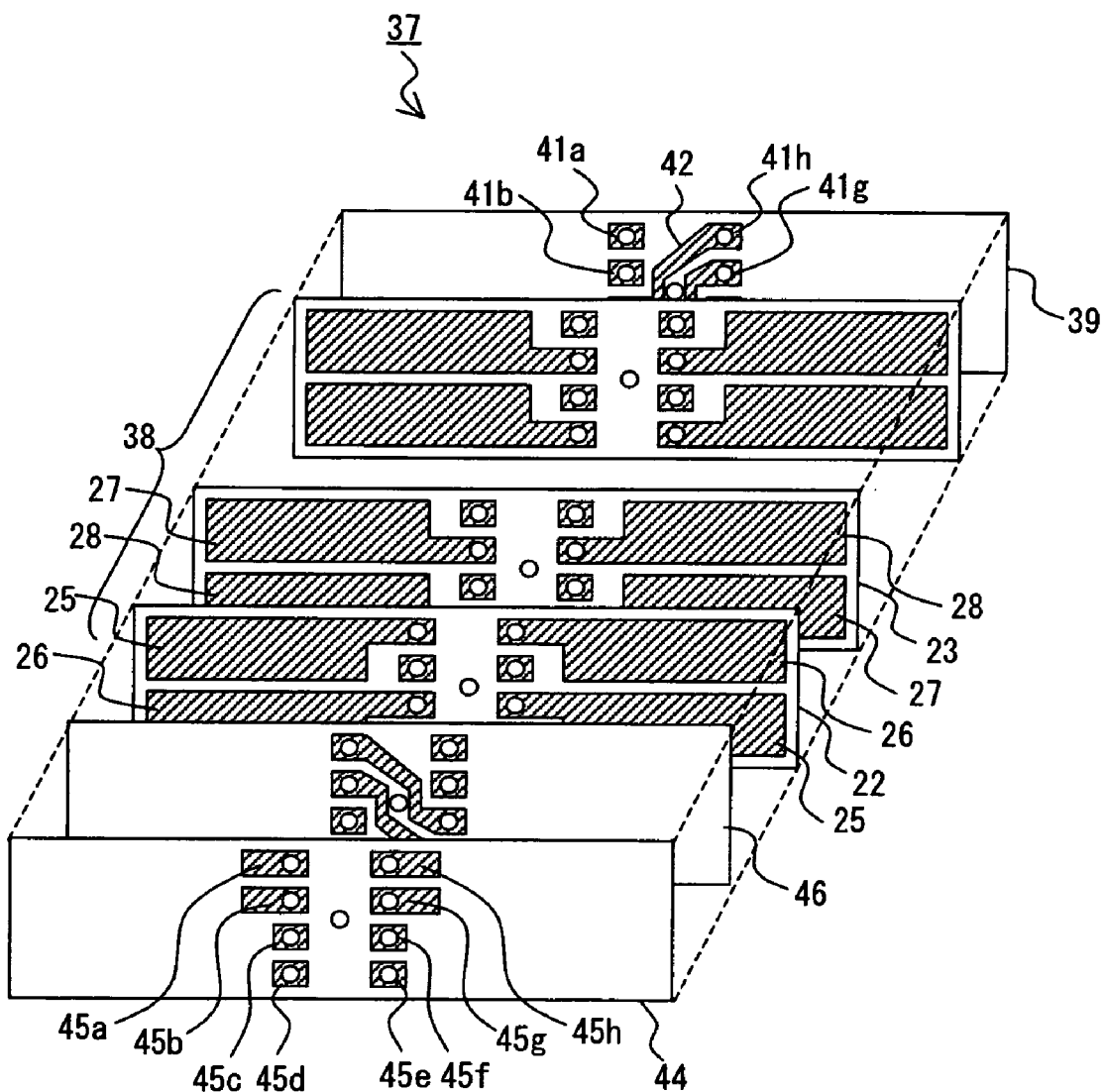
F I G. 6

ULTRASONIC OSCILLATOR

CROSS REFERENCE TO RELATED APPLICATION

This application is based upon and claims the benefit of priority from the prior Japanese Application No. 2004-274708, filed Sep. 22, 2004, the entire contents of which are incorporated herein by reference.

BACKGROUND OF THE INVENTION

1. Field of the Invention

The present invention relates to an ultrasonic oscillator having a layered structure of internal electrodes with piezoelectric elements and in particular to an ultrasonic oscillator enabling a miniaturization by a comprisal of specific electrode wiring.

2. Description of the Related Art

In recent years, ultrasonic motors have been in the spot light as new motors replacing electromagnetic motors. An ultrasonic motor has an advantage over a conventional electromagnetic motor in terms of (a) gaining a high thrust at low speeds without a reduction gear; (b) large holding force; (c) a long stroke and high resolution; (d) a low noise emission; (e) no magnetic noise emission or susceptible to noise, et cetera.

The inventing entity of the present invention has proposed one basic comprisal of conventional ultrasonic motor with such advantages, namely, a linear ultrasonic motor using an ultrasonic oscillator (e.g., refer to a Japanese patent laid-open application publication No. 07-163162; refer to paragraphs 0035 through 0040, FIGS. 7 and 18).

Also proposed, while taking advantage of the above noted characteristics, is an ultrasonic motor used for a drive power source for a camera cone of a camera by integrating an oscillator with the camera cone, which is the lens holding member, so as to advance or retract the camera cone against a fixed shaft by the oscillator (e.g., refer to a Japanese patent laid-open application publication No. 08-179184; refer to the abstract, and FIG. 1).

Let it describe the basic comprisal of the conventional ultrasonic oscillator and ultrasonic motor at this moment.

FIG. 1 describes an example comprisal of ultrasonic oscillator for use in the conventional ultrasonic motor, with the top part being an exploded perspective view of basic substantial part of the ultrasonic oscillator and the bottom part being a front view of assembled ultrasonic oscillator.

The ultrasonic oscillator 1 shown by the bottom part of FIG. 1 is made up of plural layers of thin rectangular piezoelectric plates 2, with a first piezoelectric plate 2a being printed by a pair of electrodes, i.e., upper internal electrode 3a and lower internal electrode 3b, and with a second piezoelectric plate 2b being printed by a pair of electrodes, i.e., upper internal electrode 3c and lower internal electrode 3d, and having a structure of layering the first piezoelectric plates 2a and second piezoelectric plate 2b alternately.

And the ultrasonic oscillator 1 is installed by a piezoelectric plate 4 at the front part of the layer of the first piezoelectric plate 2a and the second piezoelectric plate 2b, at the center part thereof and the back part thereof, respectively, with these piezoelectric plates 4 with no electrode and the one layered at the center part featuring a hole 5 at an approximate position of the common nodes between a longitudinal oscillation and bending oscillation.

The above described upper internal electrode 3a and lower internal electrode 3b are formed to extend to the front side of the ultrasonic oscillator 1 (as shown by FIG. 1), while the upper internal electrode 3c and lower internal electrode 3d are formed to extend to the rear side thereof.

Each of these piezoelectric plates 2a and 2b is made by printing an electrode on a green sheet of PZT, followed by positioning, layering and baking. Subsequently, four of external electrodes 6 are placed, as positive electrodes, on the side surface where the upper internal electrode 3a and lower internal electrode 3b of the ultrasonic oscillator 1 expose themselves onto, while four thereof are placed, as negative electrodes, on the far side surface where the upper internal electrode 3c and lower internal electrode 3d expose themselves onto as shown by the bottom part of FIG. 1.

And, the external electrode 6 placed on the top left of the front side is connected with the one placed on the bottom right by way of a lead wire 7 in order to form a phase-A (positive pole), while the external electrode 6 placed on the top right of the front side is likewise connected with the one placed on the bottom left by way of another lead wire 7 in order to form a phase-B (positive pole).

While not shown herein, other four external electrodes 6 placed on the rear side of the ultrasonic oscillator 1 are also connected likewise in order to form a phase-A (negative pole) and phase-B (negative pole). An application of DC voltage to the electrodes phases-A and -B carries out a polarization processing.

And, a drive contact unit 8 is adhered onto the lower surface of the ultrasonic oscillator 1 at a point where the amplitude of later described bending oscillation comes to an approximate maximum, and another drive contact unit 8 is adhered onto the upper surface thereof at a point where the amplitude of bending oscillation comes to an approximate maximum.

An ultrasonic oscillator 1 with the drive contact units 8 being adhered as shown by the bottom part of FIG. 1 will be called as such, while one without a drive contact unit 8 (i.e., a comprisal shown by the top part of FIG. 1 is stacked together and baked, followed by completing the connection with the external electrodes by lead wires) will be called an oscillator body 1a, hereinafter respectively.

In the above described comprisal of the ultrasonic oscillator 1, an application of alternate voltage to the phases-A and -B of external electrodes 6 with the phase difference of π/2 will excite a large elliptic oscillation at the above described points of the drive contact units 8.

The top and center parts of FIG. 2 are diagonal perspective views illustratively describing an ultrasonic elliptic oscillation of the oscillator body 1a of the ultrasonic oscillator 1 oscillated by applying a voltage to the electrodes comprised as above described, and the bottom part thereof shows the bi-dimensional bending oscillation shown by the center part thereof only by contour lines of the oscillator body for easier understanding.

First, an application of alternate voltage, of the same phase, in the neighborhood of resonance frequency to the phase-A electrodes 6 and 6, and phase-B electrodes 6 and 6, of the ultrasonic oscillator 1 shown by the lower part of FIG. 1, excites a unidimensional longitudinal oscillation made up of a stationary position 8 and resonance bending oscillation position 9. In this event, the oscillator body 1a mainly expands & contracts in the longitudinal direction and at the same time the sizes of the up to down, and the left to right, of the center part expands & contracts.

Also in the lower part of FIG. 1, an application of alternate voltage, of opposite phase, in the neighborhood of resonance frequency to the above described phase-A electrodes 6 and 6, and phase-B electrodes 6 and 6 excites a bidimensional bending oscillation made up of a stationary position 11 and resonance bending oscillation position 12 in the oscillator body 1a as shown by the center part of FIG. 2. In this event, the parts of the oscillator body 1a are oscillating mainly in the up and down directions as shown by the drawing.

These oscillations have been estimated by a computer analysis using a finite element method, with a result of ultrasonic oscillation testing actually having backed it up.

Incidentally, the bottom part of FIG. 2 also shows the movements of two drive contact units 13 mounted onto the upper and lower surfaces, respectively, of the oscillator body 1a shown by the bottom part of FIG. 1, in addition to the stationary position 11 and resonance bending oscillation position 12.

In order to transmit power from the oscillator body 1a to a drive support member in high efficiency, the drive contact units 13 shall be desirably placed fixedly at a position, or nearby, where the oscillation of the ultrasonic oscillator 1 in the direction opposite to the drive support member becomes the highest as shown.

The top and center parts of FIG. 2 also show a pin member 15 mounted into the hole 5 (shown by the bottom part of FIG. 1) which has been featured at the position of the center part 14 which comes to a node of oscillation shown by the bottom part of FIG. 2.

FIG. 3 shows illustratively an elliptic oscillation of the drive contact unit 13 of the ultrasonic oscillator 1 when applying an alternate voltage in the neighborhood of the resonance frequency with the phase difference of $\pi/2$.

Note that FIG. 3 shows a connected type which connects drive contact units 13 with a plate member 16. Also note that the below described movement of elliptic oscillation is the same if the drive contact units 13 were respectively independent drive contact units unconnected by a plate member 16.

The top part of FIG. 3 shows an action in the case of the phase of alternate voltage applied to the phase-A electrodes 6 and 6 is in advance of that to the phase-B electrodes 6 and 6 by $\pi/2$, with the drive contact units 13 mounted onto the bottom surface of the oscillator body 1a rotating CCW (counterclockwise), while the drive contact units 13 mounted onto the top surface thereof rotating CW (clockwise).

And the bottom part of FIG. 3 shows an action in the case of the phase of alternate voltage applied to the phase-A electrodes 6 and 6 is behind that to the phase-B electrodes 6 and 6 by $\pi/2$, with the drive contact units 13 mounted onto the bottom surface of the oscillator body 1a rotating CW, while the drive contact units 13 mounted onto the top surface thereof rotating CCW.

As described above, it is desirable to place the drive contact units 13 on the same surface of the oscillator body 1a so as to rotate in the same direction and at the same time place the drive contact units 13 on the opposite side so as to rotate in the opposite direction. This makes it possible to take out a relative drive force vis-à-vis the drive support member most effectively.

FIG. 4 shows a basic form of engagement between an ultrasonic oscillator and two shafts which are drive support members in an ultrasonic linear motor. Note that the showing of FIG. 4 assigns the same component numbers where the configuration is the same as that of FIG. 3, and omits some components shown by FIG. 1 such as the external electrodes.

In FIG. 4, the ultrasonic oscillator 1 is sandwiched between a stationary shaft 17-1 on the top and movable shaft 17-2 on the bottom, with a coil spring 18 applying force upwards on the both ends of the movable shaft 17-2.

And the form of contacting engagement between the drive contact units 13 and shafts 17 (i.e., 17-1 and 17-2) on the top and bottom, respectively, is such that the contacting part between the guide shaft 17 in the form of a round shaft and convex of the drive contact units 13 is circular in compliance with the outer shape of the round guide shaft 17.

By this, an elliptic oscillation compounded by the longitudinal oscillation and bending oscillation of the oscillator body 1a acts on the shafts 17 which sandwich the ultrasonic oscillator 1 by way of four of the drive contact units 13 from the top and bottom so as to advance or retract the ultrasonic oscillator 1 in the left or right directions in the way delineated by the drawing along the guide between the round outer shape of the shafts 17 and circular concave contact surface of each drive contact unit 13 of the ultrasonic oscillator 1.

While not shown in FIG. 4, the ultrasonic oscillator 1 is installed by a pin member 15 protrusively off the side surface thereof as shown by the top and center parts of FIG. 2. Supporting the upper and lower shafts 17 (i.e., 17-1 and 17-2) and the coil spring 18 by a main apparatus, and connecting the pin member 15 with a driven member will make the driven member advance or retract in the same direction as advancing or retracting movement of the ultrasonic oscillator 1 vis-à-vis the upper and lower shafts 17.

Or, supporting the pin member 15 by the main apparatus and connecting the driven member with the upper and lower shafts 17 (i.e., 17-1 and 17-2) and the support member of the coil springs 18 will make the driven member advance or retract in the same direction as advancing or retracting movement of the upper and lower shafts 17, i.e., leftward and rightward, driven by the ultrasonic oscillator 1. This is the principle of operation of an ultrasonic linear motor. In the above described ultrasonic linear motor, the ultrasonic oscillator has a vital role after all. For instance, in the case of using an ultrasonic motor as a drive source for advancing and retracting movement of the lens frame of a digital camera with a rapid change to downsizing, a miniaturization of ultrasonic oscillator as the heart of ultrasonic motor is an urgent need.

SUMMARY OF THE INVENTION

An ultrasonic oscillator according to the present invention, being the one having external electrodes connected with internal electrodes, each of which is alternately layered with each of piezoelectric elements, comprises a group of internal electrodes divided into four approximately equal parts along two directions, i.e., a second direction which is perpendicular to a direction of layers as first direction, and a third direction which is also perpendicular to the first direction; and a first group of external electrodes and a second group thereof respectively connected with the internal electrodes, wherein an application of alternate voltage to the first and second groups of external electrodes excites a longitudinal oscillation mode which generates a main oscillation in the aforementioned second direction and simultaneously a bending oscillation mode which generates a main oscillation in the aforementioned third direction, thereby generating an ultrasonic elliptic oscillation; the ultrasonic oscillator comprising an electrode connection-use conductor film which is formed along a face perpendicular to the aforementioned direction of layers for electrically connecting a predetermined external electrode among the first group of external electrodes with a predetermined external electrode among the second group of external electrodes, respectively.

BRIEF DESCRIPTION OF THE DRAWINGS

FIG. 2 shows diagonal perspective views illustratively describing an ultrasonic elliptic oscillation of an oscillator body of ultrasonic oscillator oscillated by applying a voltage to the conventional electrodes, and a bidimensional bending oscillation only by contour lines of the oscillator body for easier understanding;

FIG. 4 shows a basic form of engagement between an ultrasonic oscillator and guide shafts which are drive support members in an ultrasonic linear motor;

FIG. 5 shows an exploded diagonal view of ultrasonic oscillator according to a first embodiment, in the lower part of the drawing; and a perspective view, from the layering face, of external electrode pattern on an insulator plate constituting the last face (i.e., rear surface of the ultrasonic oscillator) in the front to rear direction of the drawing, in the upper part thereof;

FIG. 6 is an exploded diagonal view of ultrasonic oscillator according to a second embodiment;

DESCRIPTION OF THE PREFERRED EMBODIMENTS

Figure 1:
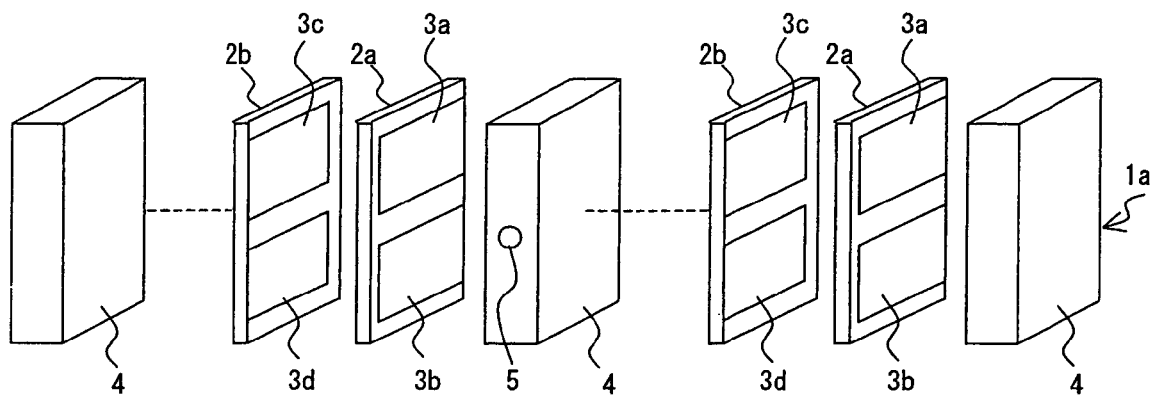
FIG. 1 describes an example comprisal of ultrasonic oscillator for use in the conventional ultrasonic motor.
Figure 1:
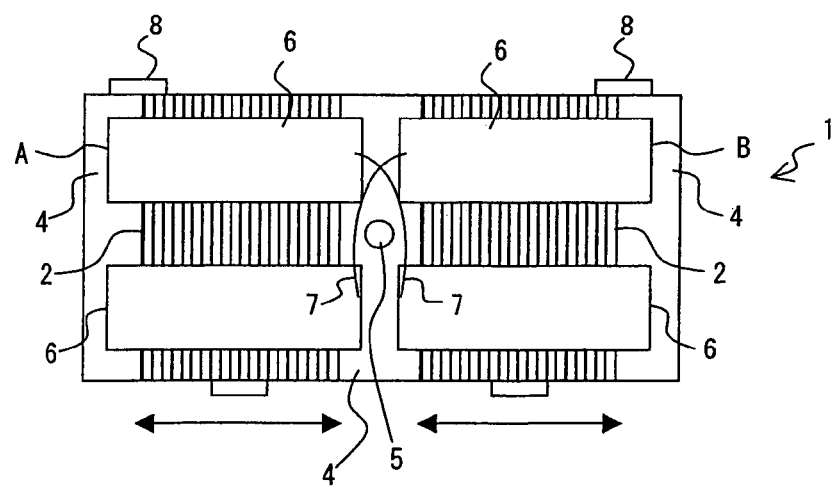
Figure 3:
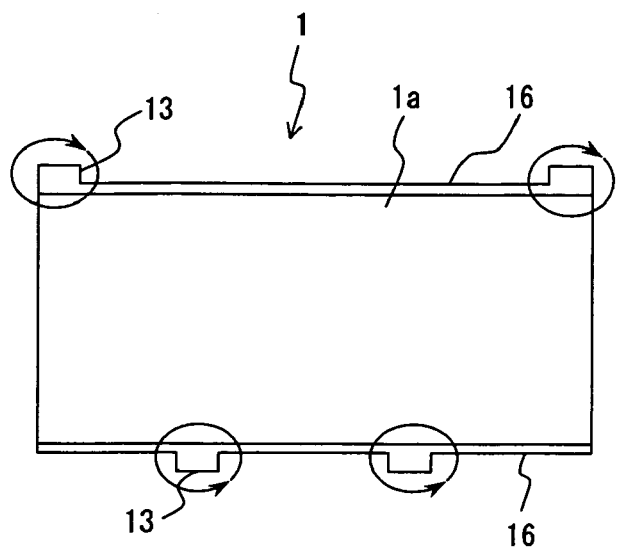
FIG. 3 shows illustratively an elliptic oscillation of drive contact unit of the ultrasonic oscillator when applying an alternate voltage in the neighborhood of the resonance frequency with the phase difference of $\pi/2$.
Figure 3:
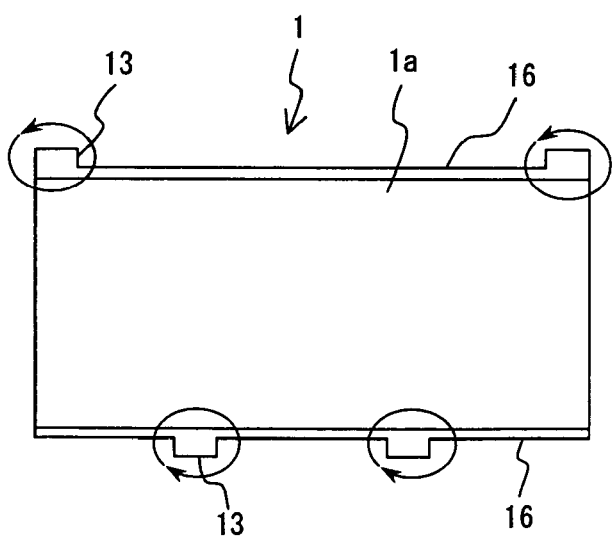

The following is a detailed description of the preferred embodiments of the present invention while referring to the accompanying drawings.

First Embodiment

FIG. 5 shows an exploded diagonal view of ultrasonic oscillator according to a first embodiment, in the lower part of the drawing; and a perspective view, from the layering face, of external electrode pattern on an insulator plate constituting the last face (i.e., rear surface of the ultrasonic oscillator) in the front to rear direction of the drawing, in the upper part thereof.

An ultrasonic oscillator 20 shown by the lower part of FIG. 5 is placed first by a phase-A external wiring-use insulator 21 on the front most face shown by FIG. 5 (N.B.: this is defined as the front face of ultrasonic oscillator 20 herein), followed by layering a predetermined number of piezoelectric members 22 having a first internal electrode pattern and of piezoelectric members 23 having a second internal electrode pattern, alternately. And a phase-B external wiring-use insulator 24 is placed on the last face (N.B.: this is defined as the rear face of ultrasonic oscillator 20 herein) in the direction toward the rear as shown by the drawing.

In other words, the above described comprisal is formed by alternately layering piezoelectric elements made up of a piezoelectric member 22 or piezoelectric member 23 and internal electrodes made up of the first or second internal electrode patterns sandwiched by the external wiring-use insulators placed on the front most and last faces.

Note that the above described piezoelectric members and insulators are made of the same material, with the difference being the piezoelectric member having gone through a polarization processing, whereas the insulator not going through it. The insulator may of course use a different material from the piezoelectric member.

In the first and second internal electrode patterns formed on the above described piezoelectric members 22 and 23, the internal electrodes are placed by dividing into four approximately equal parts in two directions respectively perpendicular to the layering direction, that is, along the up to down direction, and the left to right direction, as shown by the drawing.

And the first internal electrode pattern of the piezoelectric member 22 has two of A-positive internal electrode 25 and two of B-positive internal electrode 26 which are respectively placed diagonally across from each other, while avoiding the center part 14 where the pin member 15 shown by FIG. 2 will be fixed onto. Also the second internal electrode pattern of the piezoelectric member 23 has two of A-negative internal electrode 27 and two of B-negative internal electrode 28 which are respectively placed diagonally across from each other, while likewise avoiding the center part 14. Furthermore, both of the first and second internal electrode patterns are formed by four through hole electrodes 29 (i.e., 29-1 and 29-2) between the left and right internal electrodes. The through hole electrode 29-1 is connected with either one of the internal electrodes divided into four parts on the same face as described above, while the through hole electrode 29-2 is isolated on the same face.

And, each through hole electrode 29-1 featured within the internal electrodes is connected with each isolated through hole electrode 29-2 of the neighboring piezoelectric members 22 or 23 toward the front and rear, with the exceptions of the piezoelectric members 22 or 23 on the front most or last faces. That is, in a different view, each isolated through hole 29-2 is connected with each through hole 29-1 featured within the internal electrode of the neighboring piezoelectric members 22 or 23 toward the front and rear.

That is, each of the internal electrodes divided into four parts is connected with the same pattern electrode as its own pattern which is placed on every other layer by way of the through hole electrodes 29-1 or 29-2. Accordingly, eight kinds of the internal electrode groups are formed by interconnecting the internal electrodes of the same pattern as the own pattern.

And the phase-A external wiring-use insulator 21 at the front most face is featured by a first group of external electrodes made up of eight external electrodes 31 (i.e., 31a through 31h).

These eight external electrodes 31 are connected with the four through hole electrodes 29-1 featured within the internal electrodes of the front most piezoelectric member 22 and four isolated through hole electrode 29-2, respectively, by way of the respective through holes.

By this, the above described first external electrode group is connected with the above described internal electrode group by way of the through hole electrodes 29.

Meanwhile, the phase-B external wiring-use insulator 24 at the last face is featured by a second group of external electrodes made up of eight external electrodes 32 (i.e., 32a through 32h).

These eight external electrodes 32 are connected with the four through-hole electrodes 29-1 featured within the internal electrodes of the last piezoelectric member 23 and four isolated through hole electrodes 29-2, respectively, by way of the respective through holes.

By this, the above described second external electrode group is also connected with the above described internal electrode group by way of the through hole electrodes 29.

Then, in the first external electrode group of the phase-A external wiring-use insulator 21 at the front most face, an external electrode 31a, which connects with a group of the A-positive internal electrodes 25 on the upper left side of the respective piezoelectric members 22 by way of the through hole electrodes 29-1 and 29-2 on the upper left side of the respective piezoelectric members 22 and 23, is connected with an external electrode 31f, which connects with a group of the A-positive internal electrodes 25 on the lower right side of the respective piezoelectric members 22 by way of the through hole electrodes 29-1 and 29-2 positioned at one step upward from the lower right side of the respective piezoelectric members 22 and 23, diagonally across from each other by way of an A-positive external electrode conductor film 33 so featured as to detour the center part.

This connects the group of the upper left A-positive internal electrodes 25 with that of the lower right A-positive internal electrodes 25, as common electrodes, which are featured independently in the respective piezoelectric members 22.

Likewise, in the first external electrode group of the phase-A external wiring-use insulator 21 at the front most face, an external electrode 31b, which connects with a group of the A-negative internal electrodes 27 on the upper left side of the respective piezoelectric members 23 by way of the through hole electrodes 29-2 and 29-1 positioned at one step down from the upper left side of the respective piezoelectric members 22 and 23, is connected with an external electrode 31e, which connects with a group of the A-negative internal electrodes 27 on the lower right side of the respective piezoelectric members 23 by way of the through hole electrodes 29-2 and 29-1 on the lower right side of the respective piezoelectric members 22 and 23, diagonally across from each other by way of an A-negative external electrode conductor film 34 so featured as to detour the center part as well.

This connects the group of the upper left A-negative internal electrodes 27 with that of the lower right A-negative internal electrodes 27, as common electrodes, which are featured independently in the respective piezoelectric members 23. Furthermore, in the second external electrode group of the phase-B external wiring-use insulator 24 on the last face, an external electrode 32c, which connects with a group of the B-positive internal electrodes 26 on the lower left side of the respective piezoelectric members 22 by way of the through hole electrodes 29-2 and 29-1 positioned at one step up from the lower left side of the respective piezoelectric members 23 and 22, is connected with an external electrode 32h, which connects with a group of the B-positive internal electrodes 26 on the upper right side of the respective piezoelectric members 22 by way of the through hole electrodes 29-2 and 29-1 on the upper right side of respective piezoelectric members 23 and 22, diagonally across from each other by way of a B-positive external electrode conductor film 35 so featured as to detour the center part.

This connects the group of the lower left B-positive internal electrodes 26 with that of the upper right B-positive internal electrodes 26, as common electrodes, which are featured independently in the respective piezoelectric members 22.

Likewise, in the second external electrode group of the phase-B external wiring-use insulator 24 on the last face, an external electrode 32d, which connects with a group of the B-negative internal electrodes 28 on the lower left side of the respective piezoelectric members 23 by way of the through hole electrodes 29-1 and 29-2 on the lower left side of the respective piezoelectric members 23 and 22, is connected with an external electrode 32g, which connects with a group of the B-negative internal electrodes 28 on the upper right side of the respective piezoelectric members 23 by way of the through hole electrodes 29-1 and 29-2 located at one step down from the upper right side of the respective piezoelectric members 23 and 22, diagonally across from each other by way of a B-negative external electrode conductor film 36 so featured as to detour the center part.

This connects the group of the lower left B-negative internal electrode 28 with that of the upper right B-negative internal electrode 28, as common electrodes, which are featured independently in the respective piezoelectric members 23.

As described above, taking out a group of external electrodes to two faces (i.e., front and rear faces) of the ultrasonic oscillator 20 by way of the through holes and attaching the conductor films on these two faces, that is, not using the other four faces, thereby connecting the internally layered common electrodes.

As such, a use of electrode connection-use conductor film for a diagonally crosswise wiring between the internally layered common electrodes, while not using a lead wire, not only improves an assembly process but also makes the ultrasonic oscillator 20 more compact because there will be no bulging on the top or bottom surfaces thereof with a lead wire.

And a connection of electrodes by a through hole can apply to the connections between first and second electrode groups, and between third and fourth electrode groups, which are mutually diagonally crosswise between the front and rear faces for example, only needing a diagonal crosswise connection on two surfaces and thus eliminating a risk of wire breaking at a corner as seen in an external wire harness in the case of sintered silver wiring for example.

Furthermore, a minimum requirement for the external electrode reduces a risk of shorting due to a contact with an external member, hence enabling a comprisal of ultrasonic oscillator with a high reliability.

Moreover, an application of electrode connection-use conductor film for a diagonal crosswise wiring makes it possible to install the diagonal crosswise wiring in the layered part within an ultrasonic oscillator, thereby further eliminating a risk of wire breaking.

Second Embodiment

FIG. 6 is an exploded diagonal view of ultrasonic oscillator according to a second embodiment. An ultrasonic oscillator 37 shown by FIG. 6 has an internal comprisal of layered part 38 by alternately layering a predetermined number of piezoelectric members 22 having a first internal electrode pattern and that of piezoelectric member 23 having a second internal electrode pattern the same as in the case of FIG. 5.

And a phase B-use insulator 39 shown by FIG. 6 corresponding to the phase-B external wiring-use insulator 24 on the rear face of FIG. 5 is an internal wiring for connecting a group of phase-B internal electrodes, and not an external wiring.

That is, there is no electrode or conductor film on the outer surface, taking the form of transplanting the layout of the second external electrode 32 (i.e., 32a through 32h) of the phase-B external wiring-use insulator 24 on the rear face as shown by FIG. 5 to the inside (i.e., layered face) and placing eight through hole electrodes 41a through 41h (N.B.: the through hole electrodes 41c through 41f are beyond the viewing of FIG. 6).

And the through hole electrodes 41c is connected with the 41h by way of a B-positive internal conductor film 42; and the through hole electrodes 41d is connected with the 41g by way of a B-negative internal conductor film 43 (N.B.: it is beyond the viewing of FIG. 6).

As in the case of FIG. 5, this connects the group of the lower left B-positive internal electrodes 26 with that of the upper right B-positive internal electrodes 26, as common electrodes, which are featured independently in the respective piezoelectric members 22; and furthermore, connects the group of the lower left B-negative internal electrode 28 with that of the upper right B-negative internal electrode 28, as common electrodes, which are featured independently in the respective piezoelectric members 23.

Meanwhile, the ultrasonic oscillator 37 shown by FIG. 6 is featured by only eight external electrodes (i.e., 45a through 45h) on the outer face of the front insulator plate 44, without connecting by a conductor film.

Instead, the present embodiment is configured to place one additional phase A-use internal insulator 46 between the front insulator plate 44 and internal layer part 38.

The electrode configuration of the phase A-use internal insulator 46 is exactly the same as the layout of the external electrode 31, and the configuration of connection by the conductor film 33 and 34, in the phase-A external wiring-use insulator 21 on the front face shown by FIG. 5, featuring eight internal through hole electrodes (N.B.: no component numbers are assigned thereto; meanwhile, two internal through hole electrodes in the lower positions are beyond the viewing of the drawing), in place of eight external electrodes.

Then, the two internal through hole electrodes and the other two out of the above described eight are respectively interconnected by two conductor films as in the case of FIG. 5.

This connects the group of the upper left A-positive internal electrodes 25 with that of the lower right A-positive internal electrodes 25, as common electrodes, which are featured independently in the respective piezoelectric members 22; and connects the group of the upper left A-negative internal electrodes 27 with that of the lower right A-negative internal electrodes 27, as common electrodes, which are featured independently in the respective piezoelectric members 23.

This processing is followed by layering the above described insulator plate 44 to insulate from the outside the connecting part of the phase A-use internal insulator 46 by the two conductor films.

In other words, this configuration can be the that the external electrodes 45a and 45f, which are connected with the bi-divided group of A-positive internal electrodes 25, respectively, by way of the through hole electrodes, among the external electrode group comprising the external electrodes (45a through 45h) on the front insulator plate 44, are interconnected in a lump through a connection by the conductor film on the phase A-use internal insulator 46; and also the external electrodes 45b and 45e, which are connected with the other bi-divided group of A-negative internal electrodes 27, respectively, by way of the through hole electrodes, are interconnected in a lump through a connection by the conductor film on the phase A-use internal insulator 46.

Likewise, it can be the that the external electrodes 45c and 45h, which are connected with the bi-divided group of B-positive internal electrode 26, respectively, by way of the through hole electrodes, are interconnected in a lump through a connection by the B-positive internal conductor film 42 of the phase B-use insulator 39; and the external electrodes 45d and 45g, which are connected with other bi-divided B-negative internal electrode group 28, respectively, by way of the through hole electrodes, are interconnected in a lump through a connection by the B-negative internal conductor film 43 (N.B.: it is beyond a viewing of the drawing) of the phase B-use insulator 39.

Therefore, a wiring from a drive board to the ultrasonic oscillator 37 is such that the external electrodes 45a and 45b are connected as the A-positive and A-negative electrodes, respectively, among the first external electrode group comprising the external electrodes 45a, 45b, 45e and 45f which are featured on the front insulator plate 44; and the external electrodes 45h and 45g are connected as the B-positive and B-negative electrodes, respectively, among the second external electrode group comprising the external electrodes 45c, 45d, 45g and 45h.

As described above, the present embodiment is configured to connect the internal electrode group with the external electrode group by featuring conductor films inside the layering, thereby preventing the front or rear of the ultrasonic oscillator from bulging to make the volume large as in the case of connection by way of lead wires; and furthermore to contain the conductor films inside, thereby reducing a risk of breaking the conductor film due to a foreign object contacting therewith.

Third Embodiment

Figure 7:
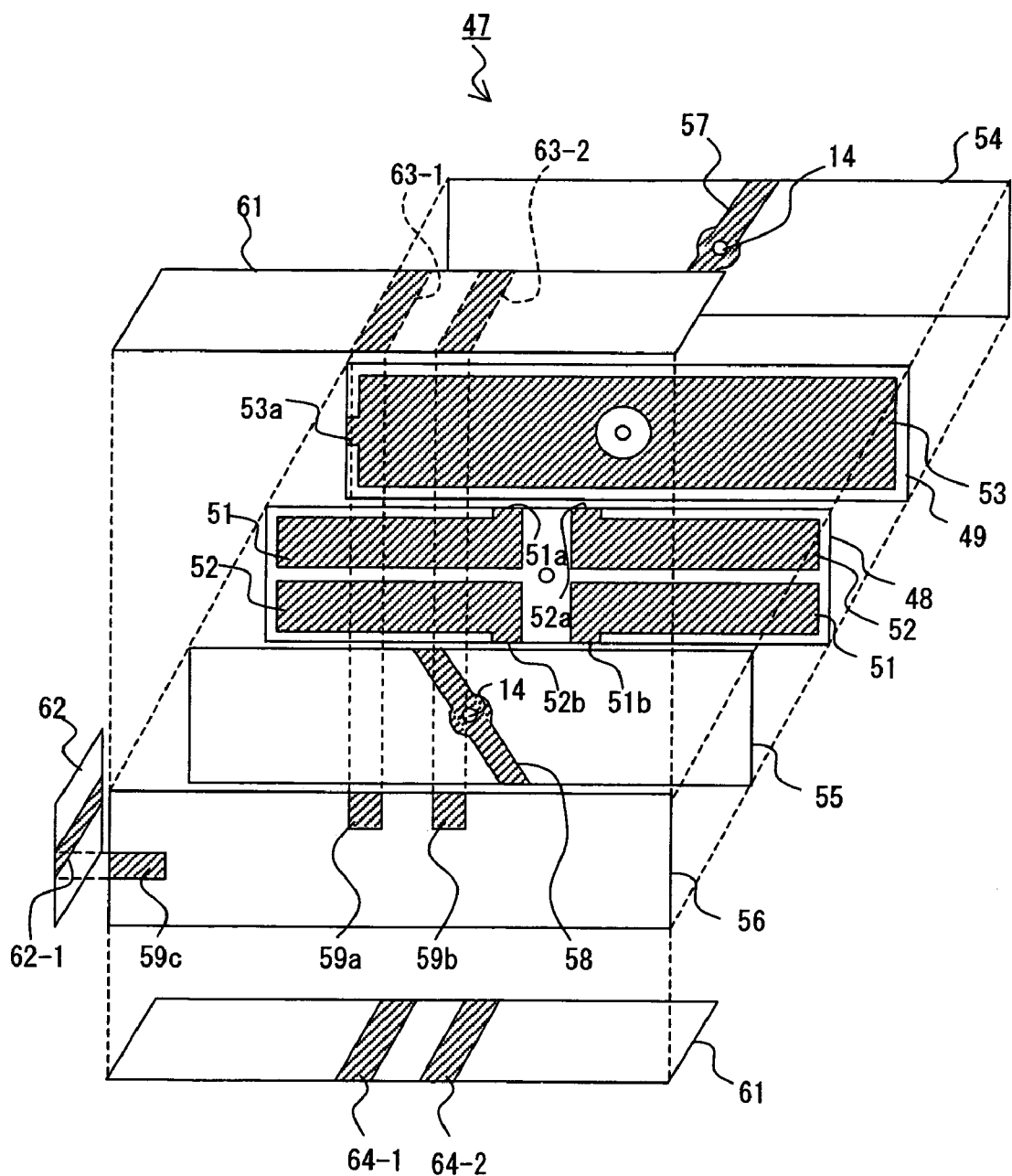
FIG. 7 is an exploded diagonal view of ultrasonic oscillator according to a third embodiment.

FIG. 7 is an exploded diagonal view of ultrasonic oscillator according to a third embodiment. An ultrasonic oscillator 47 shown by FIG. 7 has an internal comprisal of layered part by alternately layering a predetermined number of piezoelectric members 48 having a first internal electrode pattern and that of piezoelectric member 49 having a second internal electrode pattern.

The first internal electrode pattern featured on the piezoelectric member 48 is divided into four parts, while leaving blank parts on the periphery of the piezoelectric member 48, forms phase-A electrodes 51 made up of the upper left and lower right parts being placed diagonally across from each other, and forms phase-B electrodes 52 made up of the lower left and upper right parts being placed diagonally across from each other.

The phase-A electrode 51 on the upper left side and the phase-B electrode 52 on the upper right side extend their respective parts to the top edge of the piezoelectric member 48 and expose the respective electrodes externally which constitute a connection-use terminal 51a and 52a, respectively. And the phase-B electrode 52 on the lower left side and the phase-A electrode 51 on the lower right side extend their respective parts to the bottom edge of the piezoelectric member 48 and expose the respective electrodes externally, thereby constituting a connection-use terminal 52b and 51b, respectively.

Meanwhile, the second internal electrode pattern featured on the piezoelectric member 49 is constituted by a common ground electrode 53 formed on the entire surface of the piezoelectric member 49 leaving only the periphery and center part blank. The common ground electrode 53 extends its center part of left edge to the left edge of the piezoelectric member 49 and exposes the edge of electrode externally, thereby constituting a connection-use terminal 53a.

Then, a rear face insulator plate 54 is layered on the last part of layered part constituting the above described piezoelectric members 48 and 49, while an internal insulator plate 55 and front face insulator plate 56 are layered in the front part. The inside face, i.e., layered face, of the rear face insulator plate 54 is featured by an conductor film 57 which passes the center part 14, extends diagonally from the lower left to upper right and exposes the top and bottom edges on the top and bottom edges of the rear face insulator plate 54, respectively.

Meanwhile, the face of the internal insulator plate 55 meeting the front face insulator plate 56 is featured by a conductor film 58 which passes the center part 14, extends diagonally from the upper left to lower right and exposes the top and bottom edges on the top and bottom edges of the internal insulator plate 55.

And, external electrodes 59a and 59b are formed on the top part of outside face of the front face insulator plate 56 at two positions, i.e., a position corresponding to the connection-use terminal 51a of the phase-A electrode 51 on the upper left and the top edge of the conductor film 58 on the internal insulator plate 55, and another position corresponding to the connection-use terminal 52a of the phase-B electrode 52 on the upper right and the top edge of the conductor film 57 on the rear face insulator plate 54. Also, an external electrode 59c is formed at a position corresponding to the connection-use terminal 53a of the common ground electrode 53 on the outer left edge of the front face insulator plate 56.

And a rectangular wire connection-use insulator plate 61 is attached on both of the top and bottom faces of the layered part forming a pillar of rectangle as a result of the above described respective parts being layered together. Also attached onto one edge of the broad side (i.e., left side as per FIG. 7) of the layered part is an approximately square-formed wire connection-use insulator plate 62.

The above described wire connection-use insulator plate 61 on the top face is featured by two conductor films 63-1 and 63-2 on the inside face.

These two conductor films 63-1 and 63-2 are connected with the above described connection-use terminal 51a group and 52a group which are exposed onto the top face of layered part, the top edge of the conductor film 58 exposed onto the top edge of the internal insulator plate 55, the top edge of the conductor film 57 exposed onto the top edge of the rear face insulator plate 54, and the external electrodes 59a and 59b formed on the top part of the front face insulator plate 56, respectively.

This connects the external electrode 59a of the front face insulator plate 56 with the phase-A electrode 51 group on the upper left side of the respective piezoelectric members 48 by way of the conductor film 63-1 of the wire connection-use insulator plate 61 on the top face and connection-use terminal 51a group. This likewise connects the external electrode 59b on the front face insulator plate 56 with the phase-B electrode 52 group on the upper right side of the respective piezoelectric members 48 by way of the conductor film 63-2 of the wire connection-use insulator plate 61 on the top face and connection-use terminal 52a group.

Meanwhile, the wire connection-use insulator plate 61 on the bottom face is featured by two conductor films 64-1 and 64-2 on the inside face.

These two conductor films 64-1 and 64-2 are connected with the above described connection-use terminal 52b group and 51b group which are exposed onto the bottom face of layered part, the bottom edge of the conductor film 58 exposed onto the bottom edge of the internal insulator plate 55, and the bottom edge of the conductor film 57 exposed onto the bottom edge of the rear face insulator plate 54, respectively.

This connects the external electrode 59a of the front face insulator plate 56 with the phase-A electrode 51 group on the lower right side of the respective piezoelectric members 48 by way of the conductor film 58 of internal insulator plate 55, connection-use terminal 51b group and conductor film 64-2 of wire connection-use insulator plate 61 on the bottom face, thus completing a connection to the external electrode 59a as common electrode, as well as the phase-A electrode 51 group on the upper left side which has already been connected to the external electrode 59a by the wire connection-use insulator plate 61 on the top face.

As described above, a connection of the conductor film 63-1 of the wire connection-use insulator plate 61 on the top face with the conductor film 64-2 of the wire connection-use insulator plate 61 on the bottom face by way of a diagonally crosswise connection inside the layered part by using the conductor film 58 of the internal insulator plate 55 will connect the phase-A electrode 51 group on the upper left side and phase-A electrode 51 group on the lower right side in a lump with the external electrode 59a of the front face insulator plate 56.

Likewise, as a result of placing the wire connection-use insulator plate 61 on the bottom face as described above, the external electrode 59b of the front face insulator plate 56 is connected with the phase-B electrode 52 group on the lower left side of the respective piezoelectric members 48 by way of the conductor film 63-2 of the wire connection-use insulator plate 61 on the top face, conductor film 57 of the rear face insulator plate 54, conductor film 64-1 of the wire connection-use insulator plate 61 on the bottom face and connection-use terminal 52b group, thus completing a connection to the external electrode 59b as common electrode, as well as the phase-B electrode 52 group on the upper right side which has already been connected to the external electrode 59b by the wire connection-use insulator plate 61 on the top face.

Also in this case, a connection of the conductor film 63-2 of the wire connection-use insulator plate 61 on the top face with the conductor film 64-1 of the wire connection-use insulator plate 61 on the bottom face by way of a diagonally crosswise connection inside the layered part by using the conductor film 57 of the rear face insulator plate 54 will connect the phase-B electrode 52 group on the upper right side with the phase-B electrode 52 group on the lower left side in a lump with the external electrode 59b of the front face insulator plate 56.

And, the inside face of the wire connection-use insulator plate 62, which is attached onto one edge of the broad side (i.e., left side as per FIG. 7) of the layered part, is featured by a conductor film 62-1 at a position corresponding to the connection-use terminal 53a of the common ground electrode 53 of respective piezoelectric members 49 and external electrode 59c of the front face insulator plate 56.

This connects the external electrode 59c of the front face insulator plate 56 with the common ground electrode 53 group in a lump by way of the conductor film 62-1 and connection-use terminal 53a group.

In the present embodiment, the electrode connection-use conductor films 57, 58, 63-1, 63-2, 64-1, 64-2 and 62-1 are all formed facing the inside of layered part.

Therefore, this case also prevents the front or rear of the ultrasonic oscillator from bulging and making the volume large as in the case of connection by way of lead wires, and furthermore contains the conductor films inside, thereby reducing a risk of breaking the conductor film due to a foreign object contacting therewith.

Note that the present embodiment is configured to connect the wire connection-use insulator plate 61, which is featured in advance by the conductor films 63-1, 63-2, 64-1 and 64-2 for connecting the electrodes, and the wire connection-use insulator plate 62, which is featured in advance by the conductor films 62-1, with the connection-use terminals 51a, 52a, 52b, 51b and 53a of the internal electrodes exposing externally onto the side face of layered part.

But, it is not limited as such, and rather it may be configured to form a wiring connection film by a conductive material such as gold, silver or aluminum directly on the external side surface of layered part along the respective layout form of the above described connection-use terminal group of the internal electrodes exposing onto the outer side face of layered part through the processes of lithography and sintering.

Fourth Embodiment

Figure 8:
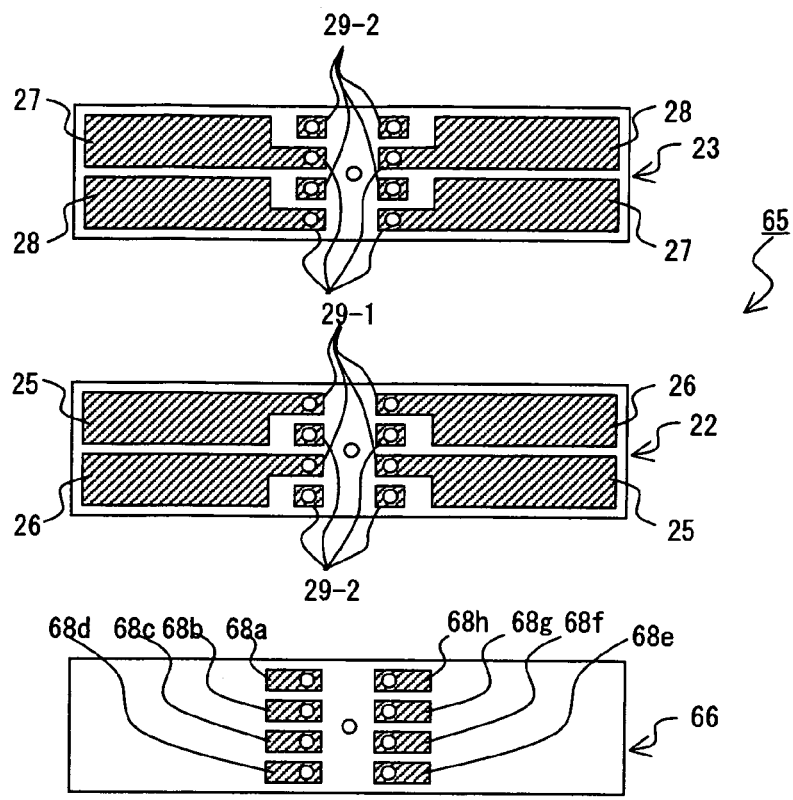
FIG. 8 is a disassembled plain view of ultrasonic oscillator according to a fourth embodiment.
Figure 8:
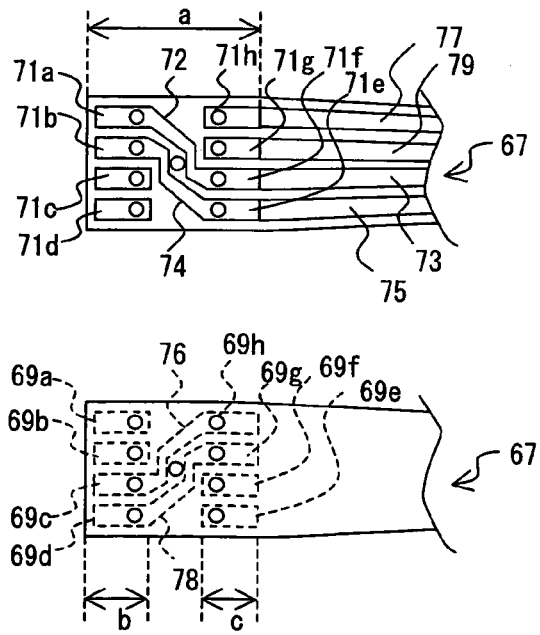

FIG. 8 is a disassembled plain view of ultrasonic oscillator 65 according to a fourth embodiment. Note that FIG. 8 assigns the same component numbers as FIGS. 5 and 6 where the configuration is the same as therewith.

FIG. 8 shows the piezoelectric member 23 with the second internal electrode pattern at the top of the drawings, followed by the piezoelectric member 22 with the first internal electrode pattern, a front face insulator plate 66, a flexible board circuit part 67 and a perspective view of electrode layout on the reverse side.

Note that FIG. 8 takes only one layer for each piezoelectric member 22 and 23 out of a state of layering a predetermined number of the former and the latter alternately, as in the case of FIGS. 5 and 6.

The front face insulator plate 66 layered on the front most in these layered parts is featured by eight external electrodes 68 (i.e., 68a through 68h) attached with a through hole.

And an external electrode 68a is connected with an A-positive internal electrode 25 group on the upper left side of the respective piezoelectric members 22 by way of the through hole electrodes 29-1 and 29-2 on the upper left side of the respective piezoelectric members 22 and 23.

And an external electrode 68b is connected with an A-negative internal electrode 27 group on the upper left side of the respective piezoelectric members 23 by way of the through hole electrodes 29-2 and 29-1 positioned at one step down from the upper left side of the respective piezoelectric members 22 and 23.

And an external electrode 68c is connected with a B-positive internal electrode 26 group on the lower left side of the respective piezoelectric members 22 by way of the through hole electrodes 29-1 and 29-2 positioned at one step up from the lower left side of the respective piezoelectric members 22 and 23.

And an external electrode 68d is connected with a B-negative internal electrode 28 group on the lower left side of the respective piezoelectric members 23 by way of the through hole electrodes 29-2 and 29-1 on the lower left side of the respective piezoelectric members 22 and 23.

And an external electrode 68e is connected with an A-negative internal electrode 27 group on the lower right side of the respective piezoelectric members 23 by way of the through hole electrodes 29-2 and 29-1 located at the lower right side of the respective piezoelectric members 22 and 23.

And an external electrode 68f is connected with an A-positive internal electrode 25 group on the lower right side of the respective piezoelectric members 22 by way of the through hole electrodes 29-1 and 29-2 positioned at one step up from the lower right side of the respective piezoelectric members 22 and 23.

And an external electrode 68g is connected with a B-negative internal electrode 28 group on the upper right side of the respective piezoelectric members 23 by way of the through hole electrodes 29-2 and 29-1 located at one step down from the upper right side of the respective piezoelectric members 22 and 23.

And an external electrode 68h is connected with a B-positive internal electrode 26 group on the upper right side of the respective piezoelectric members 22 by way of the through hole electrodes 29-1 and 29-2 positioned at the upper right side of the respective piezoelectric members 22 and 23.

The eight through hole-attached external electrodes 68 (i.e., 68a through 68h) of the front face insulator plate 66 are respectively connected with eight rear face wiring terminals 69 (i.e., 69a through 69h) of a flexible board wiring unit 67 shown by the lower parts of FIG. 8.

The above described eight rear face wiring terminals 69 (i.e., 69a through 69h) are respectively connected with eight front face wiring terminals 71 (i.e. 71a through 71h) placed on the front face of the flexible board wiring unit 67 by way of the through holes thereof.

The front face wiring terminal 71a connected with the rear face wiring terminal 69a of the flexible board wiring unit 67 is connected with the front face wiring terminal 71f connected with the rear face wiring terminal 69f by way of a front face conductor film 72 so formed as to detour the center part, with the front face wiring terminal 71f on the one end being connected with a front face A-positive wiring 73.

This makes the A-positive wiring 73 of the flexible board wiring unit 67 supply the A-positive internal electrode 25 group placed on the upper left and lower right sides of the respective piezoelectric members 22 of the ultrasonic oscillator 65 with an A-positive phase voltage.

Meanwhile, the front face wiring terminal 71b connected with the rear face wiring terminal 69b of the flexible board wiring unit 67 is connected with the front face wiring terminal 71e connected with the rear face wiring terminal 69e by way of a front face conductor film 74 so formed as to detour the center part, with the front face wiring terminal 71e on the one end being connected with a front face A-negative wiring 75.

This makes the A-negative wiring 75 of the flexible board wiring unit 67 supply the A-negative internal electrode 27 group placed on the upper left and lower right sides of the respective piezoelectric members 23 of the ultrasonic oscillator 65 with an A-negative phase voltage.

Furthermore, the rear face wiring terminals 69c and 69h of the flexible board wiring unit 67 are connected by a rear face conductor film 76 so formed as to detour the center part, with the rear face wiring terminal 69h on the one end being connected with a front face B-positive wiring 77 by way of the front face wiring terminal 71h.

This makes the B-positive wiring 77 of the flexible board wiring unit 67 supply the B-positive internal electrode 26 group placed on the upper right and lower left sides of the respective piezoelectric members 22 of the ultrasonic oscillator 65 with a B-positive phase voltage.

And the rear face wiring terminals 69d and 69g of the flexible board wiring unit 67 are connected by a rear face conductor film 78 so formed as to detour the center part, with the rear face wiring terminal 69g on the one end being connected with a front face B-negative wiring 79 by way of the front face wiring terminal 71g.

This makes the B-negative wiring 79 of the flexible board wiring unit 67 supply the B-negative internal electrode 28 group placed on the upper right and lower left sides of respective piezoelectric members 23 of the ultrasonic oscillator 65 with a B-negative phase voltage.

Incidentally, in the flexible board wiring unit 67 shown by the lower parts of FIG. 8, while the wiring parts are all covered by a protective thin film layer (i.e., overlay) such as a suitable insulative plastic, the overlay are removed from the areas shown by length "a" on the front face, and lengths "b" and "c" on the rear face.

Such processing of removing the overlay is for the purpose of reducing a load on the oscillating action of the ultrasonic oscillator 65.

As described above, the present embodiment is configured to wire-connecting the common electrode group by a diagonally crosswise wiring for the flexible board, thereby eliminating a need of lead wire and hence effective for miniaturization in this case as well.

Also, the flexible board accommodating a difference in position of internal electrodes due to placing a diagonally crosswise wiring will only require one set of outputs, A and B on the part of the driver for driving the internal electrode group.

Also, since a flexible board is not yet connected at the time of polarization, there is no risk of a polarization occurring between conductive films, hence capable of maintaining a high reliability.

Fifth Embodiment

Figure 9:
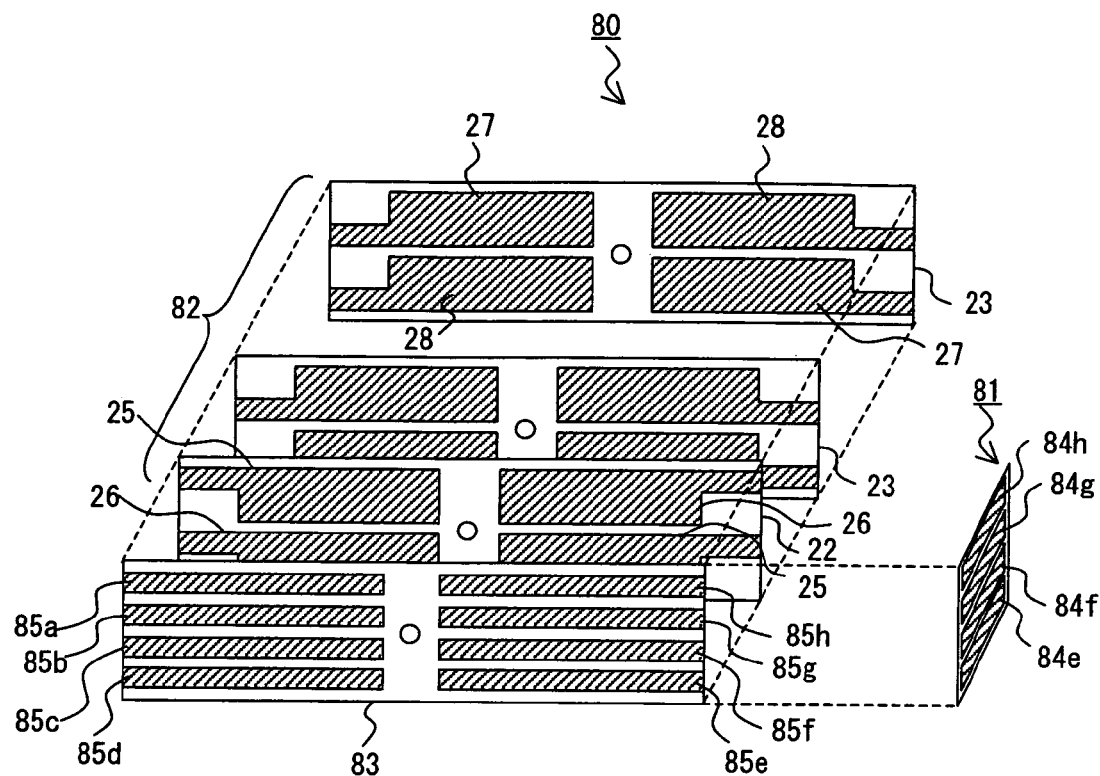
FIG. 9 shows an exploded diagonal view of ultrasonic oscillator according to a fifth embodiment; a wiring on the right broad side after finishing layering; and a flexible board wiring unit and a perspective view of electrode layout on the rear surface.
Figure 9:
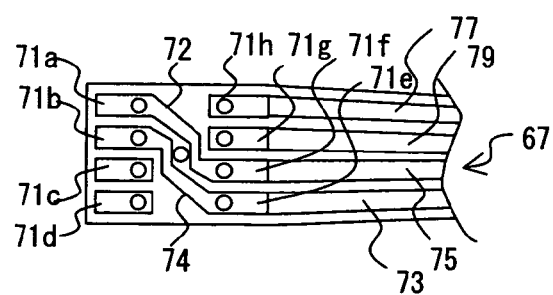
Figure 9:
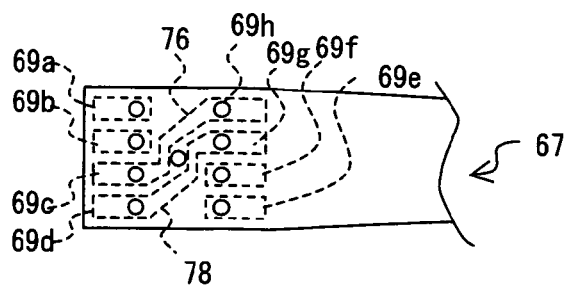

FIG. 9 shows an exploded diagonal view of ultrasonic oscillator 80 according to a fifth embodiment in the top part; a wiring on the right broad side edge face 81 after finishing layering to the right of the top part; and a flexible board wiring unit 67 and a perspective view of electrode layout on the rear surface in the lower part of the drawing.

The ultrasonic oscillator 80 shown by FIG. 9 comprises an internal layer part 82 and a front external wiring plate 83. The internal layer part 82 is so featured that the extended parts of each internal electrode group for the purpose of connecting with the through hole electrode shown by FIGS. 5, 6 and 8, that is, the connection terminal groups, all extend onto the right broad side 81 and left broad side (not shown herein) of the layered part, exposing externally as shown by FIG. 9.

Incidentally, the internal layer part 82 is assigned by the same component numbers as with FIGS. 5, 6 and 8 for the comprisal whose functions are the same as in the case of the above mentioned figures.

The right broad side edge face 81 shown by the top part of FIG. 9 is featured by four wirings 84e through 84h which are processed by a photolithography and sintering.

These wirings 84e, 84f, 84g and 84h are connected with the A-negative internal electrode 27 on the lower right side of the piezoelectric member 23, A-positive internal electrode 25 on the lower right side of the piezoelectric member 22, B-negative internal electrode 28 on the upper right side of the piezoelectric members 23 and B-positive internal electrode 26 on the upper right side of the piezoelectric member 22, respectively; and further with the external wirings 85e through 85h of the front external wiring plate 83, respectively.

While not shown in the drawing, the left broad side edge face 82 is also featured by four wirings 84a through 84d which are processed by a photolithography and sintering.

These wirings 84a, 84b, 84c and 84d are connected with the A-positive internal electrode 25 on the upper left side of the piezoelectric member 22, A-negative internal electrode 27 on the upper left side of the piezoelectric member 23, B-positive internal electrode 26 on the lower left side of the piezoelectric member 22 and B-negative internal electrode 28 on the lower left side of the piezoelectric member 23, respectively; and further connected with the external wirings 85a through 85d of the front external wiring plate 83, respectively.

That is, the external wirings 85a through 85d of the front external wiring plate 83 respectively correspond to the through hole-attached external electrodes 68a through 68h featured in the front face insulator plate 66 shown by FIG. 8.

Then, the external wirings 85 (i.e., 85a through 85h) of the front external wiring plate 83 are connected with the flexible board wiring unit 67 in the same manner as shown by FIG. 8.

As described above, the present embodiment is configured to form no through-hole in the piezoelectric members, hence maintaining a higher breaking strength of the piezoelectric members due to a stress caused by their oscillating actions.

Sixth Embodiment

Figure 10:
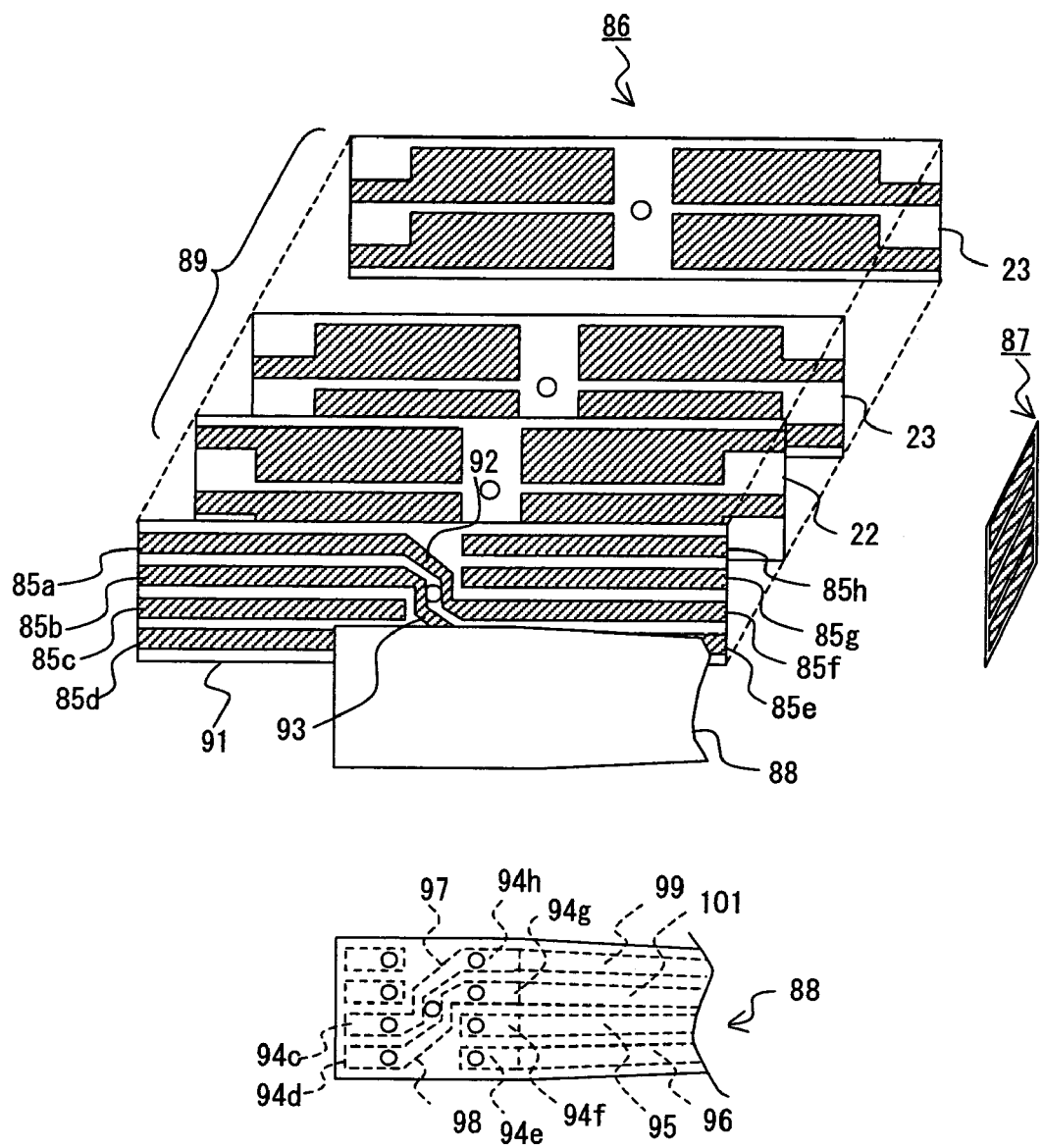
FIG. 10 shows an exploded diagonal view of ultrasonic oscillator according to a sixth embodiment; a wiring on the right broad side after finishing layering; and a flexible board wiring unit and a perspective view of electrode layout on the rear surface.

FIG. 10 shows an exploded diagonal view of ultrasonic oscillator 86 according to a sixth embodiment in the top part; a wiring on the right broad side end face 87 after finishing layering to the right of the top part; and a flexible board wiring unit 88 with one face wiring, and a perspective view of electrode layout from the rear surface in the bottom part of the drawing.

The ultrasonic oscillator 86 shown by FIG. 10 has the same comprisal for internal layer part 89 and wiring aspect for its right broad side end face 87 and left broad side end face as the comprisal for the internal layer part 82 and the wiring aspect for the right broad side end face 81 and left broad side end face which have been described in association with showing, or not showing, by FIG. 9.

In the present embodiment, a front external wiring plate 91 is a little different from the front external wiring plate 83 shown by FIG. 9, in which the left side external wirings 85a and 85b, among the external wirings 85e through 85h as in the case of FIG. 9, are diagonally crosswise connected with the right side external wirings 85f and 85e, respectively, by way of conductor films 92 and 93 which are so featured as to detour the center part, respectively.

This connects the A-positive internal electrode 25 group (also refer to FIG. 9 hereinafter), which are placed diagonally on the upper left and lower right sides from each other of the piezoelectric member 22, in a lump with the external wirings 85a and 85f; and the A-negative internal electrode 27 group, which are placed diagonally on the upper left and lower right sides from each other of the piezoelectric member 23 in a lump with the external wirings 85b and 85e.

Then, so much so that an adhesion of flexible board wiring part 88 is connected to the front external wiring plate 91, the above described connected, in a lump, A-positive internal electrode 25 group and A-negative internal electrode 27 group are connected to drive wirings 95 and 96 of the flexible board wiring part 88, by way of terminals 94f and 94e of the flexible board wiring part 88, on the inside face of which the external wirings 85f and 85e are placed.

On the other hand, in the inside face of the flexible board wiring part 88, terminals 94c and 94d, which are connected with the external wirings 85c and 85d of the front external wiring plate 91, are diagonally crosswise connected with terminals 94h and 94g, respectively, which are connected with the external electrodes 85h and 85g of the front external wiring plate 91, by way of conductor films 97 and 98 which are so featured to detour the center part.

This connects the external wirings 85c and 85d with the external wirings 85h and 85g, respectively, by way of the diagonally crosswise conductor films 97 and 98 of the flexible board wiring part 88.

Putting all together, the B-positive internal electrode 26 groups are connected in a lump by way of the external wirings 85c and 85h, and the terminals 94c and 94h and conductive film 97 of the flexible board wiring part 88; and then connected with a drive wiring 99 of the flexible board wiring part 88.

Meanwhile, the B-negative internal electrode 28 groups are connected in a lump by way of the external wirings 85d and 85g, and the terminals 94d and 94g and conductive film 98 of the flexible board wiring part 88; and then connected with a drive wiring 101 of the flexible board wiring part 88.

As described above, the present embodiment is configured to form a diagonal crosswise connection by applying a conductor film for each of the phase-A external terminal of the external wiring plate and phase B-use terminal of the flexible board, eliminating a need to feature a pin hole for the terminal thereof as shown by FIG. 9.

This configuration reduces not only a production cost of flexible board but also a thickness thereof, hence decreasing a load on the ultrasonic oscillator 86.

Seventh Embodiment

Figure 11:
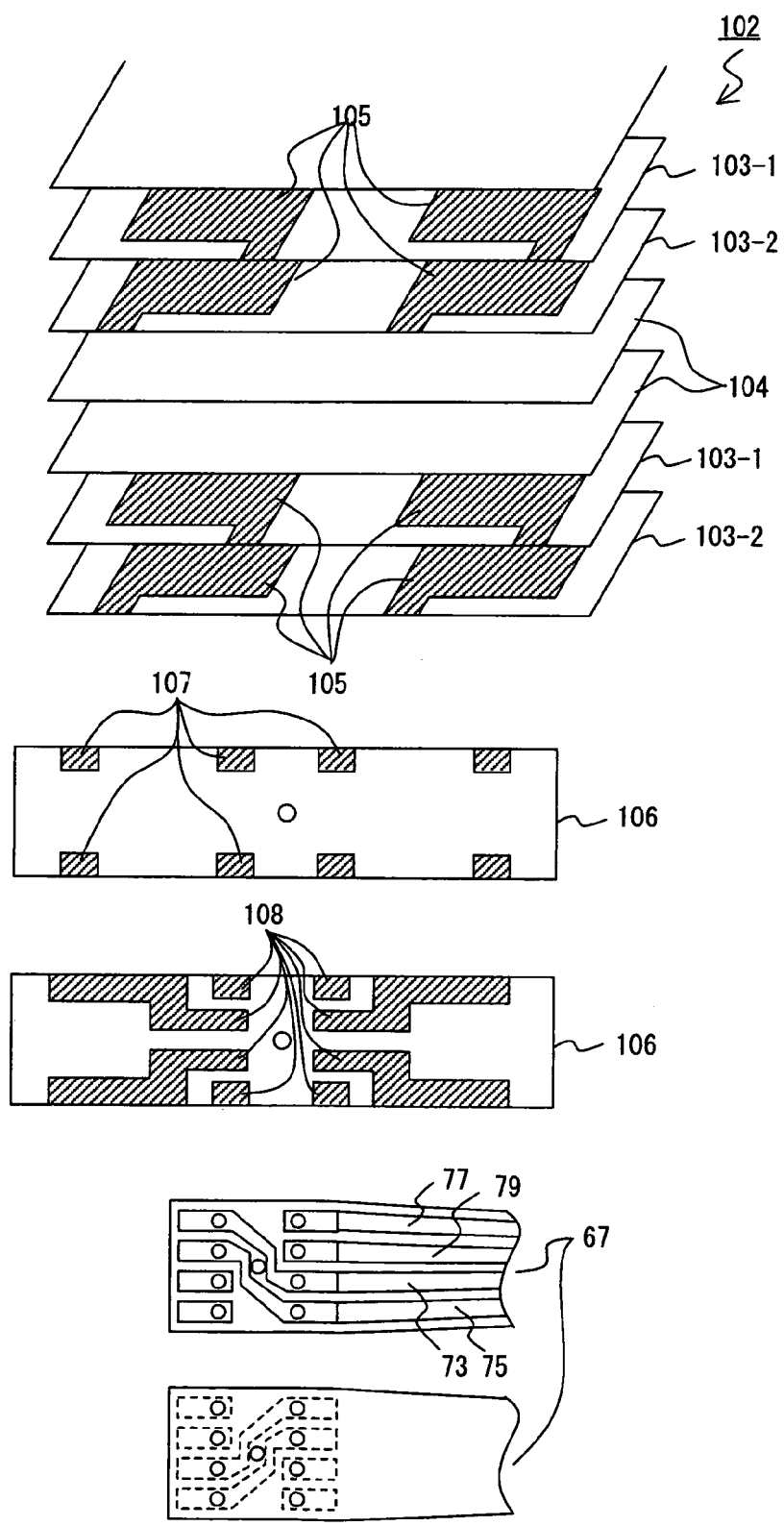
FIG. 11 shows an exploded diagonal view of ultrasonic oscillator according to a seventh embodiment; a group of exposed terminals onto the front face after finishing layering; wirings connecting the aforementioned terminals; and a flexible board wiring unit and a perspective view of electrode layout on the rear surface.

FIG. 11 shows an exploded diagonal view of ultrasonic oscillator 102 according to a seventh embodiment in the top part of the drawing; a placement of a group of internal electrode terminals exposing onto the front face after finishing layering in a lower part thereof; followed by a state of wirings connecting the aforementioned internal electrode terminals by applying a photolithography and sintering; and a flexible board wiring unit and a perspective view of electrode layout on the rear surface in the bottom parts of the drawing.

In the ultrasonic oscillator 102 shown by FIG. 11, the inside layer part comprises piezoelectric members and internal electrodes being layered on top of each other vis-à-vis insulator plates with external electrodes, which is different from the comprisal in which they are layered from front to back in parallel with insulator plates with external electrodes as shown by FIGS. 5 and 6.

Also, in this embodiment, polarized piezoelectric members, that is, the ones placed by internal electrodes, 103 (i.e., 103-1 and 103-2) sandwich a group of un-polarized piezoelectric members, that is, the ones not placed by internal electrodes, 104, from the top and bottom.

The above described group of piezoelectric members 104 with no placement of internal electrode comprises an excitation part for exciting a specific oscillation mode.

As shown by FIG. 11, internal electrodes 105 are placed in eight different ways as in the case of FIGS. 5 and 6 as seen in the placement of internal electrode terminal group 107 exposing onto the front face 106 at the completion of layering as a result of forming an internal electrode 105 separately in the left and right on each piezoelectric member 103 and dividing the internal electrode 105 into the top and bottom by an excitation part at the center (i.e., a group of un-polarized piezoelectric members 104).

The present embodiment is configured to form an electrode film for an internal electrode terminal group 107, which expose onto the front face 106, distributing themselves from the left to right and top to bottom, after the layering, by applying a photolithography and sintering, thereby featuring four external electrodes 108 on either side of the center part of the front face after the completion of layering.

And these eight external electrodes 108 are connected with a flexible board wiring unit 67 the same as in the case of FIG. 9.

This will make respective two internal electrodes 105 among those placed in eight different ways become four common internal electrode groups which then connect themselves with drive wirings 73, 75, 77 and 79 of the flexible board wiring unit 67.

Eighth Embodiment

Figure 12:
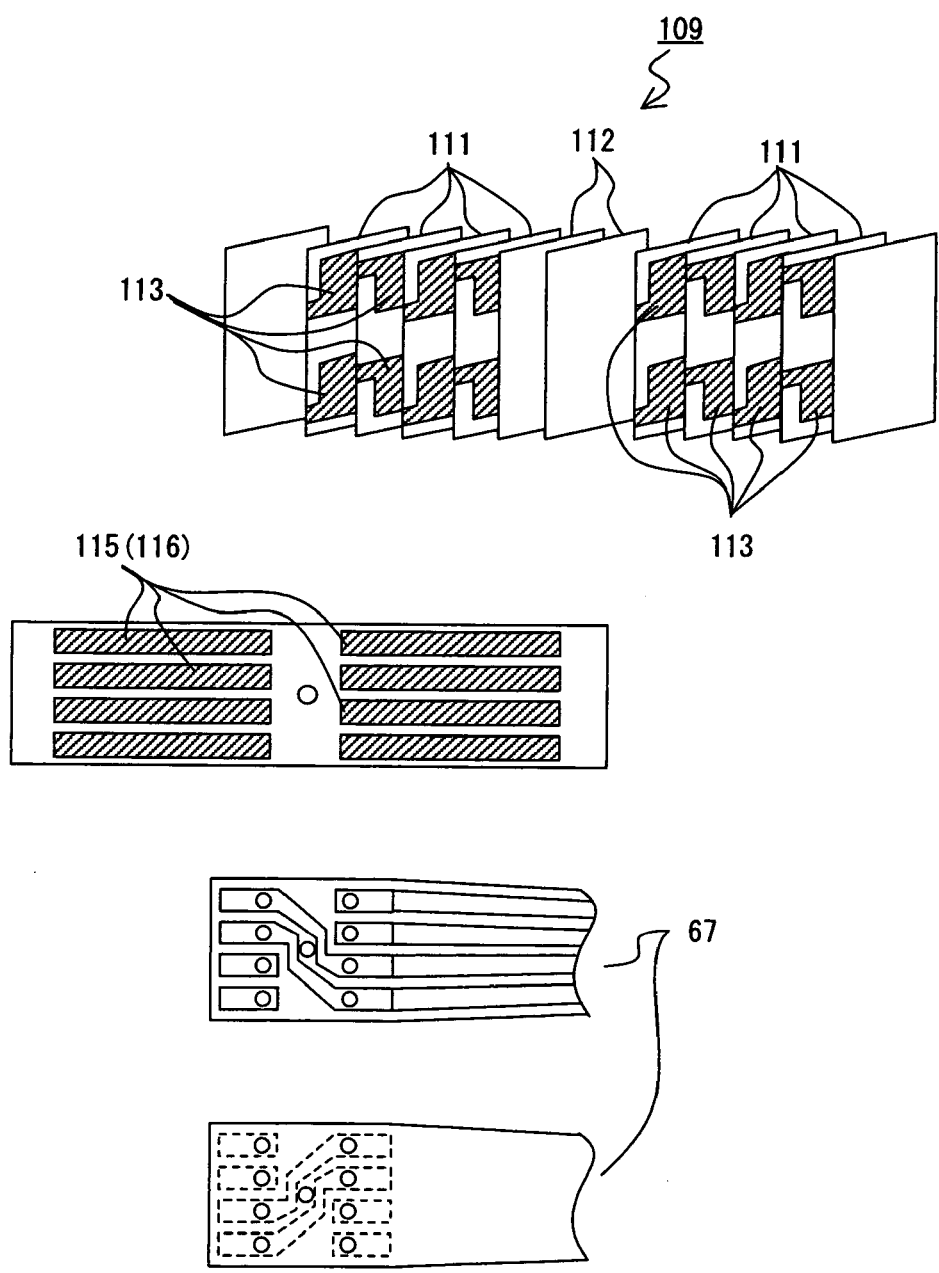
FIG. 12 shows an exploded diagonal view of ultrasonic oscillator according to an eighth embodiment; wirings connecting a group of exposed terminals on the front face after finishing layering; and a flexible board wiring unit and a perspective view of electrode layout on the rear surface.

FIG. 12 shows an exploded diagonal view of ultrasonic oscillator 109 according to an eighth embodiment in the top part of the drawing; wirings to connect a group of internal electrode terminals exposing onto the front face after finishing layering in a lower part thereof; followed by a flexible board wiring unit and a perspective view of electrode layout on the rear surface in the bottom part of the drawing.

In the ultrasonic oscillator 109 shown by FIG. 12, the inside layer part comprises piezoelectric members and internal electrodes being layered in the left to right direction vis-à-vis insulator plates featured with external electrodes, which is different from the comprisal in which they are layered from the front to back in parallel with insulator plates featured with external electrodes as shown by FIGS. 5 and 6, or the one in which they are layered on top of each other vis-à-vis insulator plates featured with external electrodes as shown by FIG. 11.

The present embodiment is configured to sandwich a group of un-polarized piezoelectric members 112 by that of polarized piezoelectric members 111 from the ups and down.

As shown by FIG. 12, internal electrodes 113 are placed in eight different ways as in the case of FIGS. 5 through 11 as seen in the placement of internal electrode terminal group 115 exposing onto the front face 114 at the completion of layering as a result of forming an internal electrode 113 separately in the left and right on each piezoelectric member 111, and dividing the internal electrode 113 into the left and right by a group of un-polarized piezoelectric members 112 at the center.

The present embodiment is configured to connect the internal electrode terminal group 115 in a lump, which expose onto the front face 114, distributing themselves from the left to right and top to bottom after the layering, by an electrode film 116 formed through applying a photolithography and sintering. Then, these eight electrode films 116 are connected with a flexible board wiring unit 67 which is the same as the one shown by FIG. 9 or FIG. 11.

This also will make respective two internal electrodes 113 among those placed in eight different ways become four common internal electrode groups which then connect themselves with four drive wirings of the flexible board wiring unit 67.

As described above, from the fourth to the eighth embodiments are configured to form a diagonally crosswise connected electrode connection-use conductor film on a flexible board, enabling one flexible board to connect a diagonal crosswise wire connection of electrodes with a piezoelectric element driver and hence eliminating a risk of wrong wiring.

Also, there is a lower risk of wire breaking as compared to a wire connection by forming the external electrodes over at the ultrasonic oscillator; a driver is only required to provide A and B outputs, with a low load on the driver board; an extended part of flexible board can be so narrow as to make it more flexible; and therefore freedom of assembly becomes much higher. Also, a flexible board is not yet attached at the time of polarization, and therefore there is no longer a risk of polarization occurring between the electrode connection-use conductor films.

As described above, the present invention comprises specific electrode wirings so as to eliminate lead wires, thereby enabling a miniaturization of ultrasonic oscillator.

What is claimed is:

1. An ultrasonic oscillator, being the one having external electrodes connected with internal electrodes, each of which is alternately layered with each of piezoelectric elements, comprising:
   a group of internal electrodes divided into four approximately equal parts along two directions, i.e., a second direction which is perpendicular to a direction of layers as first direction, and a third direction which is also perpendicular to the first direction; and
   a first group of external electrodes and a second group thereof respectively connected with the internal electrodes, wherein
   an application of alternate voltage to the first and second groups of external electrodes excites a longitudinal oscillation mode which generates a main oscillation in the aforementioned second direction and simultaneously a bending oscillation mode which generates a main oscillation in the aforementioned third direction, thereby generating an ultrasonic elliptic oscillation;
   the ultrasonic oscillator comprising
   an electrode connection-use conductor film which is formed along a face perpendicular to the aforementioned direction of layers for electrically connecting a predetermined external electrode among the first group of external electrodes with a predetermined external electrode among the second group of external electrodes, respectively.

2. The ultrasonic oscillator according to claim 1, comprising a through hole, being connected with the electrode connection-use conductor film, and being formed within the ultrasonic oscillator along the direction of the layer, for connecting electrically the internal electrodes mutually and also conductive with the first group of external electrodes and with the second group of external electrodes, respectively.

3. The ultrasonic oscillator according to claim 2, wherein the electrode connection-use conductor film is formed on a surface of the ultrasonic oscillator.

4. The ultrasonic oscillator according to claim 2, wherein the electrode connection-use conductor film is formed in the inside of the ultrasonic oscillator.

5. The ultrasonic oscillator according to claim 1, wherein the electrode connection-use conductor film is formed in the inside of the ultrasonic oscillator.

6. The ultrasonic oscillator according to claim 1, wherein the electrode connection-use conductor film is formed on a surface of flexible board which is featured with an electric supply wiring.

7. The ultrasonic oscillator according to claim 6, comprising a plurality of the electrode connection-use conductor films, with a part thereof being formed on a surface of the ultrasonic oscillator.

8. An ultrasonic oscillator, having external electrodes connected with internal electrodes, each of which is alternately layered with each of piezoelectric elements, comprising:
   a first layer part for including at least an internal electrode which has been divided into two parts along a second direction perpendicular to the layering direction, i.e., a first direction;
   a second layer part for including at least an internal electrode which has been divided into two parts along the second direction;
   a group of first external electrodes being equipped per predetermined internal electrodes of the first layer part so as to interconnect the aforementioned internal electrodes; and
   a group of second electrodes being equipped per predetermined internal electrodes of the second layer part so as to interconnect the aforementioned internal electrodes, wherein
   an application of alternate voltage to the group of first external electrodes and/or the group of second external electrodes excites a longitudinal oscillation mode in which a main oscillation occurs in a third direction that is perpendicular to the first and second directions and simultaneously a bending oscillation mode in which a main oscillation occurs in the first direction, thereby generating an ultrasonic elliptic oscillation, wherein
   the group of first external electrodes and the group of second external electrodes are both formed on the side surface of the ultrasonic oscillator along the direction of layer, and a flexible board featuring a feeding wiring includes, on the board, an electrode connection-use conductor film for connecting a predetermined external electrode, among the group of first external electrodes, electrically with that among the group of second external electrodes.

9. An ultrasonic oscillator, having external electrodes connected with internal electrodes, each of which is alternately layered with each of piezoelectric elements, comprising:
- a first layer part for including at least an internal electrode which has been divided into two parts along a second direction perpendicular to the layering direction, i.e., a first direction;
- a second layer part for including at least an internal electrode which has been divided into two parts along the second direction;
- a group of first external electrodes being equipped per predetermined internal electrodes of the first layer part so as to interconnect the aforementioned internal electrodes; and
- a group of second electrodes being equipped per predetermined internal electrodes of the second layer part so as to interconnect the aforementioned internal electrodes, wherein an application of alternate voltage to the group of first external electrodes and/or the group of second external electrodes excites a longitudinal oscillation mode in which a main oscillation occurs in the first direction and simultaneously a bending oscillation mode in which a main oscillation occurs in a third direction that is perpendicular to the first and second directions, wherein the group of first external electrodes and the group of second external electrodes are both formed on the side surface of the ultrasonic oscillator along the direction of layer, and a flexible board featuring a feeding wiring includes on the board an electrode connection-use conductor film for connecting a predetermined external electrode among the group of first external electrodes electrically with that among the group of second external electrodes.

* * * * *